United States Patent
Chu et al.

(10) Patent No.: US 6,705,089 B2
(45) Date of Patent: Mar. 16, 2004

(54) TWO STAGE COOLING SYSTEM EMPLOYING THERMOELECTRIC MODULES

(75) Inventors: Richard C. Chu, Hopewell Junction, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/115,903

(22) Filed: Apr. 4, 2002

(65) Prior Publication Data

US 2003/0188538 A1 Oct. 9, 2003

(51) Int. Cl.⁷ .................. F25B 21/02; F25D 23/12
(52) U.S. Cl. ............ 62/3.2; 62/259.2; 165/104.33; 136/204; 361/697
(58) Field of Search .................. 62/3.2, 332, 3.3, 62/3.7, 259.2; 165/104.33, 80.3, 80.4; 361/687, 689, 699, 688, 697, 695; 136/203, 204

(56) References Cited

U.S. PATENT DOCUMENTS

| | | | |
|---|---|---|---|
| 5,584,183 A | 12/1996 | Wright et al. ............ | 62/3.7 |
| 5,731,954 A | 3/1998 | Cheon ..................... | 361/699 |
| 5,737,923 A | 4/1998 | Gilley et al. ............. | 62/3.7 |
| 5,890,371 A * | 4/1999 | Rajasubramanian et al. ............. | 62/259.2 |
| 5,918,469 A | 7/1999 | Cardella ................. | 62/3.7 |
| 5,934,079 A * | 8/1999 | Han et al. ................ | 62/3.2 |
| 5,970,729 A * | 10/1999 | Yamamoto et al. ........ | 62/332 |
| 6,058,712 A * | 5/2000 | Rajasubramanian et al. .. | 62/3.6 |
| 6,164,076 A | 12/2000 | Chu et al. ................ | 62/3.7 |
| 6,166,907 A | 12/2000 | Chien .................... | 361/699 |
| 6,196,003 B1 | 3/2001 | Macias et al. ............ | 62/3.7 |
| 6,234,240 B1 | 5/2001 | Cheon ................... | 165/80.3 |
| 6,298,669 B1 | 10/2001 | Maruyama et al. ........ | 62/3.2 |

FOREIGN PATENT DOCUMENTS

| | | | |
|---|---|---|---|
| EP | WO 98/08038 | 2/1998 | ............ H05K/7/20 |
| JP | 4155162 A | 5/1992 | ............ H01L/35/30 |
| JP | 11340522 | 12/1999 | ............ H01L/35/32 |

OTHER PUBLICATIONS

Ohkubo et al., pending U.S. patent application, Ser. No. 09/741,844, filed Dec. 21, 2000, entitled "Heat Exchanger", Publication No. US 2001/0013224 A1, publication date Aug. 16, 2001.

Chu et al., pending U.S. patent application entitled "Thermoelectric–Enhanced Heat Spreader For Heat Generating Component Of An Electronic Device", Ser. No. 09/606,984, filed Jun. 29, 2000.

Chu et al., pending U.S. patent application entitled "Thermal Spreader and Interface Assembly for Heat Generating Component Of An Electronic Device", Ser. No. 09/606,619, filed Jun. 29, 2000.

(List continued on next page.)

Primary Examiner—Chen Wen Jiang
(74) Attorney, Agent, or Firm—Andrew J. Wojnicki, Jr., Esq.; Kevin P. Radigan, Esq.; Heslin Rothenberg Farley Mesiti P.C.

(57) ABSTRACT

A cooling system is provided for cooling a heat generating component of an electronic device. The cooling system includes at least two cooling subsystems for a staged reduction of the temperature of a cooling fluid exposed to heat generated by the heat generated component. A first stage cooling subsystem reduces the temperature of the cooling fluid to ambient temperature or above, while a second stage cooling subsystem reduces the temperature of the cooling fluid exiting the first stage cooling subsystem to below ambient temperature. The first stage cooling subsystem is passive while the second stage cooling subsystem is active and can include one or more thermoelectric modules.

8 Claims, 4 Drawing Sheets

OTHER PUBLICATIONS

Chu et al., pending U.S. Patent application entitled "Electronic Module With Integrated Programmable Thermoelectric Cooling Assembly and Method of Fabrication", Ser. No. 09/726,909, filed Nov. 30,2000.

Chu et al., pending U.S. patent application entitiled "Cooling System With Auxiliary Thermal Buffer Unit For Cooling An Electronic Module", Ser. No. 09/867,855, filed May 30, 2000.

Chu et al., pending U.S. patent application entitled "Electronic Module With Integrated Thermoelectric Cooling Assembly", Ser. No. 09/726,900, filed Nov. 30, 2000.

"Thermoelectric–Enhanced Heat Exchanger," by Chu et al., Ser. No. 10/116,099, co–filed herewith.

* cited by examiner

TWO STAGE COOLING SYSTEM EMPLOYING THERMOELECTRIC MODULES

CROSS-REFERENCE TO RELATED APPLICATIONS

This application contains subject matter which is related to the subject matter of the following applications and patents which are assigned to the same Assignee as this application. The below-listed applications and patents are hereby incorporated herein by reference in their entirety:

"THERMOELECTRIC-ENHANCED HEAT EXCHANGER," by Chu et al., Ser. No. co-filed herewith;

"COOLING SYSTEM WITH AUXILIARY THERMAL BUFFER UNIT FOR COOLING AN ELECTRONIC MODULE," by Chu et al., Ser. No. 09/867,855, filed May 30, 2001;

"THERMOELECTRIC-ENHANCED HEAT SPREADER FOR HEAT GENERATING COMPONENT FOR AN ELECTRONIC DEVICE," by Chu et al, Ser. No. 09/606,984, filed Jun. 29, 2000;

"THERMAL SPREADER AND INTERFACE ASSEMBLY FOR HEAT GENERATING COMPONENT OF AN ELECTRONIC DEVICE," by Chu et al., Ser. No. 09/606,619, filed Jun. 29, 2000;

"ELECTRONIC MODULE WITH INTEGRATED THERMOELECTRIC COOLING ASSEMBLY," by Chu et al., Ser. No. 09/726,900, filed Nov. 30, 2000;

"ELECTRONIC MODULE WITH INTEGRATED PROGRAMMABLE THERMO-ELECTRIC COOLING ASSEMBLY AND METHOD OF FABRICATION," by Chu et al., Ser. No. 09/726,909, filed Nov. 30, 2000; and "THERMOELECTRIC COOLING ASSEMBLY WITH THERMAL SPACE TRANSFORMER INTERPOSED BETWEEN CASCADED THERMOELECTRIC STAGES FOR IMPROVED THERMAL PERFORMANCE," by Chu et al., U.S. Pat. No. 6,164,076, issued Dec. 26, 2000.

TECHNICAL FIELD

The present invention is generally directed to cooling systems and, more particularly, to an enhanced cooling system having a passive first stage, for reducing temperature of a cooling fluid to near ambient temperature or above, and an active second stage, for further reducing temperature of the cooling fluid below ambient temperature. The cooling system may be used for enhanced cooling of heat generating components in, for example, an electronic device such as a mainframe computer or other electronic system requiring cooling.

BACKGROUND OF THE INVENTION

As is well known, as the circuit density of electronic chip devices increases in order to achieve faster and faster processing speed, there is a correspondingly increasing demand for the removal of heat generated by these devices. The increased heat demand arises both because the circuit devices are packed more closely together and because the circuits themselves are operated at increasingly higher clock frequencies. Nonetheless, it is also known that runaway thermal conditions and excessive heat generated by chips is a leading cause of failure of chip devices. Furthermore, it is anticipated that the demand for heat removal from these devices will increase indefinitely. Accordingly, it is seen that there is a large and significant need to provide useful cooling mechanisms for electronic circuit devices.

The use of large thermoelectric cooling elements is known. These elements operate electronically to produce a cooling effect. By passing a direct current through the legs of a thermoelectric device, a temperature difference is produced across the device which may be contrary to that which would be expected from Fourier's Law.

At one junction of the thermoelectric element both holes and electrons move away, toward the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (air or water). When direct current is passed through these thermoelectric modules a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the module.

By varying the electrical current passing through a thermoelectric module, thermoelectric cooling elements are capable of handling varying heat loads. However, one drawback of thermoelectric cooling elements is their low coefficient of performance (COP). COP refers to the ratio of the net cooling effect to the power required by the thermoelectric cooling elements. Typically, when thermoelectric modules are employed in a cooling system, substantially all of the heat transferred from a cooling fluid is transferred through the thermoelectric modules. This total transfer of heat load requires a considerable amount of power to operate the thermoelectric cooling elements effectively. Since a high amount of power is required, the COP of the entire cooling system is low.

Moreover, conventional thermoelectric modules have relatively low heat flux capability. Generally, individual thermoelectric modules exhibit relatively low heat flux capability in the order of a few watts/cm$^2$ at any useful temperature difference from hot side to cold side.

Therefore, there is a need to further enhance cooling systems, particularly systems employing thermoelectric modules, for more efficient cooling of electronic devices or other heat generating components.

DISCLOSURE OF THE INVENTION

The shortcomings of the prior approaches are overcome, and additional advantages are provided, by the present invention which in one aspect is a cooling system which reduces in two or more stages the temperature of a cooling fluid exposed to a heat generating component of an electronic device. A first stage uses a first heat exchanger to reduce the temperature of the cooling fluid to near ambient temperature or above, while one or more second stages comprise a second heat exchanger employing, for example, thermoelectric modules to reduce the temperature of the cooling fluid exiting the first heat exchanger to below ambient temperature. Advantageously, heat removed from the cooling fluid by the first heat exchanger does not pass through the thermoelectric cooling elements of the second heat exchanger. Therefore, less power is required to operate the thermoelectric modules by avoiding the entire heat load being handling by the thermoelectric modules. Since less power is required, the COP of the entire system is increased.

To restate, a fluid-based cooling system for cooling a heat generating component in accordance with an aspect of the present invention employs a first stage cooling system and a second stage cooling system. The first stage cooling subsystem reduces a temperature of the cooling fluid to near ambient temperature or above. The second stage cooling subsystem is in fluid communication with the first stage cooling subsystem, and further reduces temperature of the cooling fluid exiting the first cooling subsystem to below ambient temperature.

In another aspect, the first stage cooling subsystem is a passive heat exchanger (e.g. air-cooled heat exchanger) and the second stage cooling subsystem is an active heat exchanger (e.g. employing thermoelectric modules).

In a further aspect, a method of fabricating a cooling system in accordance with an aspect of the present invention includes thermally coupling a heat transfer device to a heat generating component, the heat transfer device being configured to carry a cooling fluid; positioning a first stage cooling apparatus in fluid communication with an output of the heat transfer device, the first stage cooling apparatus being configured to reduce a temperature of the cooling fluid to near ambient temperature or above; and positioning a second heat exchanger in fluid communication with an output of the first heat exchanger, the second stage cooling apparatus being configured to reduce the temperature of the cooling fluid exiting the first stage cooling apparatus to below ambient temperature.

Advantageously, by reducing the temperature of a cooling fluid exposed to a heat generating component before passing it through a heat exchanger employing thermoelectric modules, less power is required to operate the thermoelectric modules, i.e., as long as at least a portion of the heat load is removed before being exposed to the thermoelectric modules. Since less power is required, the overall COP of the cooling system is increased.

Additional features and advantages are realized through the techniques of the present invention. Other embodiments and aspects of the invention are described in detail herein and are considered part of the claimed invention.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Generally stated, provided herein is a cooling system for facilitating cooling of an electronic device. The cooling system thermally couples to a heat generating component, such as, for example, an integrated circuit chip, disposed within the electronic device. The cooling system reduces the temperature of a cooling fluid thermally coupled to the heat generating component in two stages using, for example, two separate heat exchangers, or cooling subsystems. For example, a first heat exchanger reduces the temperature of the cooling fluid to near ambient temperature or above and a second heat exchanger reduces the temperature of the cooling fluid exiting the first heat exchanger to below ambient temperature. At least a portion of the heat transferred from the cooling fluid by the first heat exchanger dissipates from the cooling system and does not pass through the second heat exchanger. In one aspect of the present invention, the first heat exchanger is a passive heat exchanger and the second heat exchanger is an active heat exchanger employing thermoelectric modules. Since the thermoelectric modules are not required to handle the entire heat load of the cooling system, less power is required to operate them, resulting in a higher COP for the entire cooling system.

Conventional vapor-compression refrigeration techniques have been used to lower the temperature of a coolant below ambient temperature (e.g., about −40° C.) after exposure to a heat generating component of an electronic device. However, conventional vapor-compression refrigeration systems have difficulty in handling variation in heat load, and are not as responsive as desired under transient operating conditions.

By using thermoelectric cooling modules instead of vapor-compression refrigeration systems, it is possible to handle variations in heat load by varying the electrical current passing through the thermoelectric modules. Thermoelectric modules also offer the advantage of rapid response to changing heat load conditions. However, as discussed above, a limitation of thermoelectric modules is their relatively low heat flux capability. Thermoelectric cooling modules also suffer from a low coefficient of performance (COP) when exposed to high heat loads because more power must be supplied to operate the modules.

Figure 1:
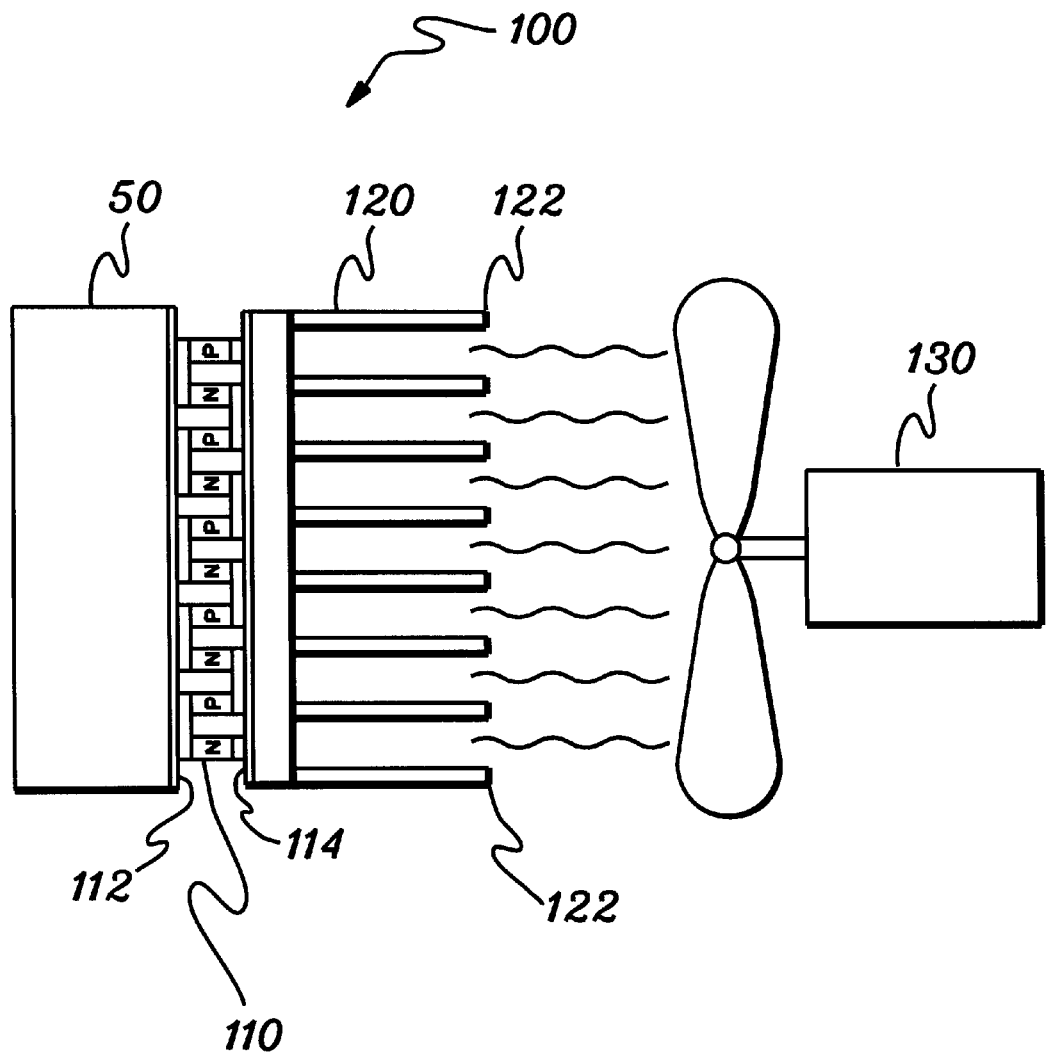
FIG. 1 depicts one embodiment of a conventional cooling system comprising direct air cooling with thermoelectric augmentation.

FIG. 1 depicts one embodiment of a conventional cooling system, generally denoted 100, employing thermoelectric modules 110 for facilitating heat removal from an electronic module 50. In this embodiment, thermoelectric modules 110 are thermally coupled directly to the heat generating components) of electronic module 50.

As shown in FIG. 1, thermoelectric modules 110 are disposed between electronic module 50 and a heat sink 120. Heat sink 120 may comprise, for example, an air-cooled heat sink having a plurality of outwardly projecting fins 122 exposed to ambient air or, alternatively, to air moved by a fan 130. It is intended to be understood that the term "fins," as used herein, includes any type of structure that provides increased surface area for heat transfer as well as the literally described and illustrated structures of substantially parallel members.

Alternatively, heat sink 120 may be a cold plate. The cold plate would be configured to carry a cooling fluid which absorbs the heat transferred from thermoelectric modules 110. One such thermoelectric cooling apparatus is described in the above-incorporated U.S. Pat. No. 6,164,076 entitled "Thermoelectric Cooling Assembly With Thermal Space Transformer Interposed Between Cascaded Thermoelectric Stages For Improved Thermal Performance."

As noted above, thermoelectric modules 110 will transfer heat from one side to the other, essentially by "electronically" pumping heat from a cold side to a hot side. In the embodiment of FIG. 1, cold side 112 of thermoelectric module 110 is thermally coupled to electronic module 50, while hot side 114 of module 110 is thermally coupled to heat sink 120. Each thermoelectric module 110 includes an array of p and n type couples which are sandwiched between the heat transfer surfaces or substrates of the thermoelectric modules.

At hot side 114 (which is thermally coupled to heat sink 120), energy is expelled from electrons within the thermoelectric modules, i.e., as the electrons jump from higher energy levels in the n-type material to lower energy levels in the p-type material. In this manner, heat absorbed at each cold side 112 is transported to the respective hot side 114 at a rate proportional to the amount of current passing through the circuit. Suitable thermoelectric module for use within the heat exchanger are commercially available.

For certain implementations, the approach of FIG. 1 may provide an insufficient or inefficient cooling performance. First, space constraints limit the effectiveness of the approach of FIG. 1. For example, air-cooled heat sink 120 should be large enough to handle the power dissipation of both the electronic module and the thermoelectric modules. Considering the confined space typically available in the vicinity of an electronic module, the cooling augmentation will be limited by the number of thermoelectric modules that can be employed. This limitation will be further exacerbated by the limited space available for the air-cooled heat sink. The effectiveness of thermoelectric augmentation will be even further reduced when using multiple electronic modules packaged closely together.

Second, the thermoelectric modules 110 employed in the approach of FIG. 1 are required to handle substantially all of the heat transferred from the electronic module 50. This results in a low COP.

Figure 2:
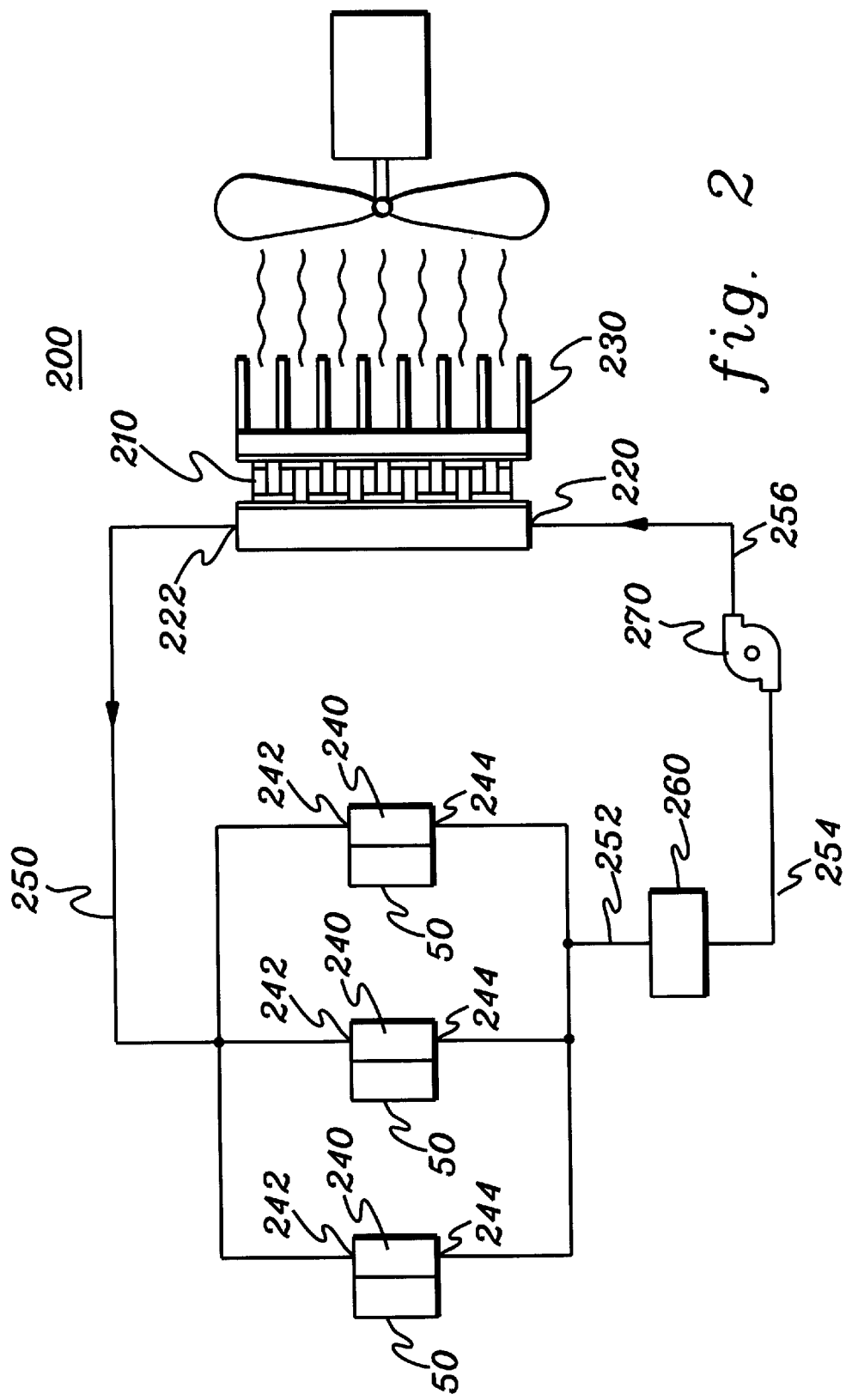
FIG. 2 depicts one embodiment of a cooling system employing hybrid liquid-air cooling with thermoelectric augmentation at a liquid-to-air heat sink, in accordance with an aspect of the present invention.

FIG. 2 depicts another embodiment of a thermoelectric cooling apparatus, generally denoted 200, in accordance with an aspect of the present invention. Unlike the embodiment shown in FIG. 1, thermoelectric modules 210 are not in direct thermal contact with the heat generating component of electronic module 50. Instead, thermoelectric modules 210 are positioned between a liquid heat transfer plate 220 and an air-cooled heat sink 230 remotely located in a part of an electronic system where more space is available. This approach allows a greater number of thermoelectric modules 210 to be placed on the liquid heat transfer plate 220 to reduce the heat flux each thermoelectric module must handle. This approach also allows for more than one heat generating component to be cooled by the same cooling apparatus.

In this embodiment, heat generating components 50 are cooled directly by liquid cooled cold plates 240, with cooling liquid (e.g. water) preferably being cooled below ambient temperature. Cold plates 240 are in fluid communication with liquid heat transfer plate 220.

As shown, thermoelectric cooling apparatus 200 includes a heat transfer plate 220 thermally coupled to a cold side of thermoelectric modules 210. The hot side of thermoelectric modules 210 is thermally coupled to an air-cooled heat sink or, alternatively, another cold plate 230. As the cooling liquid flows through heat transfer plate 220, heat transferred to the cooling liquid from heat generating component(s) 50, which is thermally coupled to cold plates 240, is transferred from the cooling liquid to heat transfer plate 220. This heat is then pumped from heat transfer plate 220 to air-cooled heat sink 235 through thermoelectric modules 210.

Thermoelectric cooling apparatus 200, particularly heat transfer plate 220, is connected to one or more cold plates 240 (disposed, e.g., in parallel) by means of a plurality of circulation conduits. A first conduit 250, which may comprise one or more branches, extends from an outlet port 222 of heat transfer plate 220 to an input port 242 of each cold plate 240. When more than one cold plate is employed, first conduit may branch off to deliver cooling fluid to each of the cold plates. A second conduit, which may comprise one or more branches, extends from an outlet port 244 of each cold plate 240 to an inlet opening or port of a liquid reservoir 260. The cooling fluid is then circulated back to heat transfer plate 220 from reservoir 260 by a pump 270 using circulation conduits 254 and 256.

For certain implementations, the approach of FIG. 2 may also provide an insufficient or inefficient performance. Similar to the embodiment depicted in FIG. 1, substantially all of the heat dissipated by the heat generating component plus the energy extracted from the cooling liquid to drop the cooling fluid below ambient air temperature is pumped through the thermoelectric modules. This requires a considerable amount of power to drive the thermoelectric modules, thereby resulting in a low overall COP.

Figure 3:
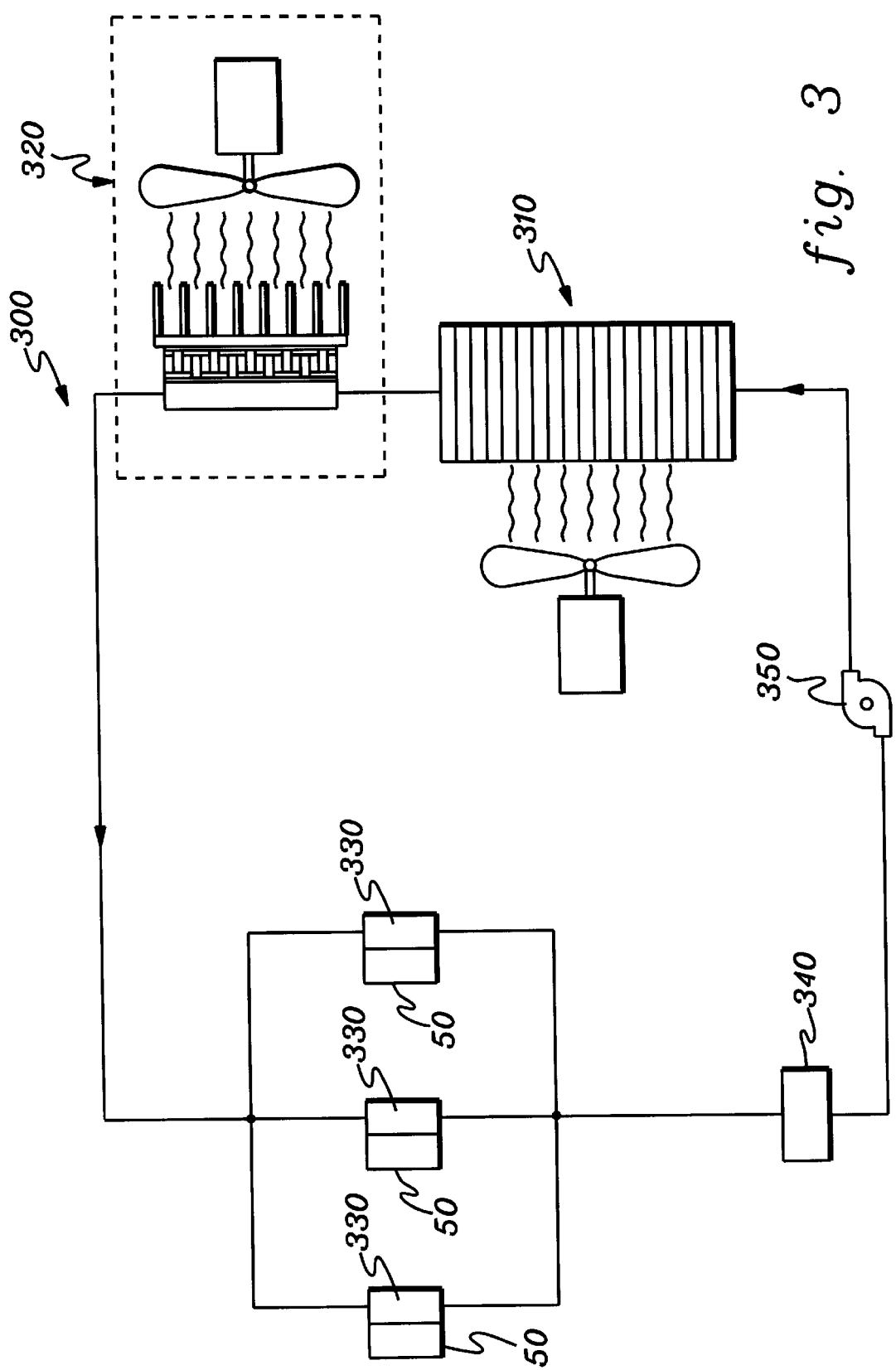
FIG. 3 depicts another embodiment of a hybrid liquid-air cooling system employing a thermoelectric aftercooler heat sink, in accordance with an aspect of the present invention.

FIG. 3 depicts another embodiment of a cooling system 300 in accordance with an aspect of the present invention. In this embodiment, the cooling system reduces the temperature of a cooling fluid exposed to the heat generating component(s) 50 below ambient temperature in at least two stages using, for example, at least two separate cooling apparatus 310, 320. In a first cooling stage, the cooling fluid is cooled to near ambient temperature or above, e.g., to within 1–2° C. of the ambient temperature. The partially cooled fluid is then cooled in a second cooling stage to a temperature below ambient temperature. At least a portion or fraction of the heat transferred from the cooling fluid by the first cooling stage dissipates or is removed from the cooling system and does not pass through, or is not handled by, the second cooling stage. In an alternate embodiment, the second cooling stage reduces the temperature of the cooling fluid exiting the first cooling stage to a temperature lower than that achievable by the first cooling stage.

As shown, cooling system 300 has first stage cooling apparatus 310 and second stage cooling apparatus 320 connected in series via circulation conduits with one or more heat transfer devices 330 (e.g. cold plates), a liquid reservoir 340, and a pump 350 to assist in circulating (or re-circulating) a first heat transfer fluid through cooling system 300. Heat transfer devices 330 are thermally coupled to heat generating component(s) of electronic modules 50.

First stage cooling apparatus 310 may include any heat exchanger capable of reducing the temperature of a cooling fluid to near ambient temperature or above ambient temperature. For example, the first stage cooling apparatus may comprise a passive heat exchanger. It is intended to be understood that the term "passive," as used herein, includes any type of heat exchanger that functions without the need of an exerted stimulus (e.g., energy) applied directly to a component of the heat exchanger in order for the heat exchanger component to operate. An exemplary passive first stage cooling apparatus 310 is a compact tube/fin heat exchanger. A tube/fin heat exchanger typically includes a plurality of spaced tubes or tube sections. Each tube comprises a passageway for carrying a cooling fluid. Fins are disposed between and thermally coupled to adjacent pairs of tubes to define passages for a second cooling fluid which may be, e.g., normal convection air flow. The convection air flow may be enhanced by, for example, forced air cooling using a fan. The fins may be folded, or alternatively, corrugated metal sheets projecting outwardly from the outer tube surfaces and extending between the gaps formed between adjacent tubes. One such tube/fin heat exchanger is described in the above-incorporated U.S. patent application by Chu et al. entitled: "THERMOELECTRIC-ENHANCED HEAT EXCHANGER."

Second stage cooling apparatus 320 may include any heat exchanger capable of reducing the temperature of the cooling fluid exiting the first stage cooling apparatus to below ambient temperature or, alternatively, to a lower temperature than achievable by first stage cooling apparatus 310. Second stage cooling apparatus may include an active heat exchanger. It is intended to be understood that the term "active," as used herein, includes any type of heat exchanger that requires an exertion or stimulus such as, for example, energy, to be applied directly to a heat exchanger component in order to operate such component as intended. Examples of an active heat exchanger are a refrigeration unit or a heat exchanger employing at least one thermoelectric module such as thermoelectric cooling apparatus 200 illustrated in FIG. 2. With respect to a thermoelectric cooling apparatus, voltage must be applied to the module to electronically pump heat from a cold side to a hot side.

Since the cooling fluid exposed to the heat generating component(s) first passes through first stage cooling apparatus 310, which reduces the temperature to a near ambient or above temperature, second cooling stage apparatus 320 is not required to handle all (or even most) of the heat transferred from the cooling fluid to drop the temperature of the cooling fluid below ambient temperature.

Preferably, heat removed by first stage cooling apparatus 310 is dissipated from cooling system 300 so as not to pass through second stage cooling apparatus 320. With this dissipation of heat from cooling system 300, the second stage cooling apparatus is only required to handle a fraction of the total system heat load. Therefore, less power is required to operate thermoelectric modules employed by second stage cooling apparatus 320. Since less power is required, the COP of the entire cooling system increases.

Figure 4:
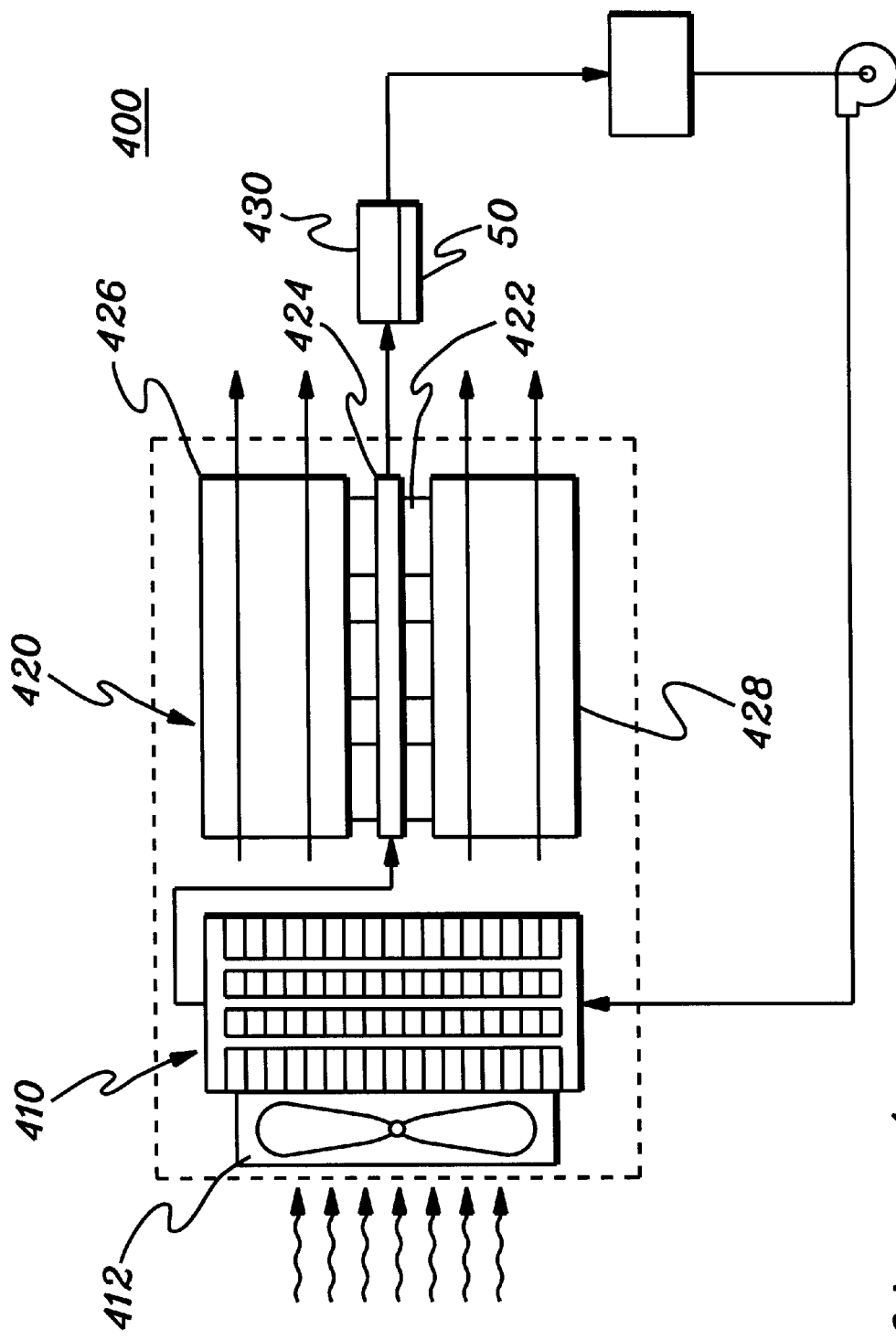
FIG. 4 depicts yet another embodiment of a hybrid liquid-air cooling system employing two axially aligned heat exchangers, in accordance with an aspect of the present invention.

FIG. 4 depicts another embodiment a cooling system 400 in accordance with an aspect of the present invention. In this embodiment, multiple cooling apparatus are again used to reduce the temperature of a cooling fluid exposed to the heat generating component(s) in multiple stages.

Cooling system includes a first stage cooling apparatus 410 and second stage cooling apparatus 420 in series with a cold plate 430 thermally coupled to an electronic module 50, a liquid reservoir 440 and a pump 450 for circulating a cooling fluid through the system. First stage cooling apparatus 410 includes a fan 412 to cause air flow across the heat transfer components of first stage cooling apparatus 410 (e.g. fins).

First stage cooling apparatus 410 may be of similar structure to first stage cooling apparatus 310 depicted in FIG. 3. Second stage cooling apparatus 410 includes a heat transfer plate 424 and thermoelectric modules 422 mounted on opposite sides of, or surrounding, heat transfer plate 424. Thermoelectric modules 422 are disposed between heat transfer plate 424 and air cooled heat sinks 426, 428.

As shown in FIG. 4, first stage cooling apparatus 410 is aligned with or positioned along the same axis as second stage cooling apparatus 420 so that air generated by fan 412 passes through or across both first stage cooling apparatus 410 and second stage cooling apparatus 420, especially across heat sinks 426, 428. Cold plate 430 which is thermally coupled to electronic module 50 may also be positioned along this same axis if desired. By using only one fan, space is conserved.

In this embodiment, some of the heat dissipated from the cooling fluid by first stage cooling apparatus 410 may also pass across second stage cooling apparatus 420. However, as long as some of the heat removed from the cooling fluid by first stage cooling apparatus 410 is dissipated from the system, less power is required to operate the thermoelectric modules 422 of second stage cooling apparatus 420. The less power required to operate thermoelectric modules 422 in second stage cooling apparatus 420, the higher the COP of the entire system.

Those skilled in the art will note from the above discussion that provided herein are various enhanced cooling systems for use in cooling electronic components, or other heat generating components (e.g., mechanical components). In certain embodiments, the cooling systems reduce temperature of a cooling fluid flowing through the system below ambient temperature in multiple stages using, for example, multiple heat exchangers. At least one of the heat exchangers may include thermoelectric modules to assist in reducing the temperature of the cooling fluid below ambient. Since the heat exchangers used in the separate stages to cool the cooling fluid are not required to handle the entire heat load of the cooling system, less power is required to operate the thermoelectric modules used. Since less power is required, the COP of the entire system is increased.

The separate stage cooling apparatus in accordance with the present invention can be readily designed for use with a specific heat generating component, e.g., an electronic module housing one or more integrated circuit chips, to achieve optimal performance.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A cooling system for cooling a heat generating component using a cooling liquid, said cooling system comprising:
   a first stage cooling subsystem, said first stage cooling subsystem reducing a temperature of the cooling liquid to ambient temperature or above;
   a second stage cooling subsystem in fluid communication with said first stage cooling subsystem, said second stage cooling subsystem further reducing temperature of the cooling liquid exiting said first cooling subsystem to below ambient temperature;
   wherein said first stage cooling subsystem comprises a first heat exchanger and said second stage cooling subsystem comprises a second heat exchanger, said second heat exchanger being an active heat exchanger, and wherein said active heat exchanger employs at least one thermoelectric module; and a fan for producing a single airstream within the cooling system, said fan being axially aligned with said first stage cooling subsystem and said second stage cooling system, wherein said fan moves said single airstream serially over said first stage cooling system and said second stage cooling subsystem.

2. The cooling system of claim 1, wherein said first heat exchanger is a passive heat exchanger.

3. The cooling system of claim 2, wherein said passive heat exchanger is an air-cooled heat exchanger.

4. The cooling system of claim 3, wherein said air-cooled heat exchanger includes tubes configured to carry the cooling liquid and transfer heat from the cooling fluid to fins exposed to said single airstream.

5. A method for fabricating a cooling system for cooling an electronic device using a cooling liquid, said method comprising:

thermally coupling a heat transfer device to a heat generating component, said heat transfer device being configured to carry the cooling liquid;

positioning a first stage cooling subsystem in fluid communication with an output of said heat transfer device, said first stage cooling subsystem being configured to reduce a temperature of the cooling liguid to ambient temperature or above;

positioning a second stage cooling subsystem in fluid communication with an output of said first stage cooling subsystem, said second stage cooling subsystem being configured to reduce temperature of the cooling liquid exiting said first stage cooling subsystem below ambient temperature;

wherein said first stage cooling subsystem comprises a first heat exchanger and said second stage cooling subsystem comprises a second heat exchanger, said second heat exchanger being an active heat exchanger, and wherein said active heat exchanger employs at least one thermoelectric module and providing a fan for producing a single airstream within the cooling system; and wherein said method further comprises axially aligning said fan, said first stage cooling subsystem and said second stage cooling subsystem, wherein when in use, said fan moves said single airstream serially over said first stage cooling subsystem and said second stage cooling subsystem.

6. The method of claim 5, wherein said first heat exchanger is a passive heat exchanger.

7. The method of claim 6, wherein said passive heat exchanger is an air-cooled heat exchanger.

8. The method of claim 7, wherein said air-cooled heat exchanger includes tubes configured to carry the cooling liquid and transfer heat from the cooling fluid to fins exposed to said single airstream.

* * * * *

UNITED STATES PATENT AND TRADEMARK OFFICE
CERTIFICATE OF CORRECTION

PATENT NO. : 6,705,089 B2
DATED : March 16, 2004
INVENTOR(S) : Chu et al.

It is certified that error appears in the above-identified patent and that said Letters Patent is hereby corrected as shown below:

<u>Column 4,</u>
Line 62, delete the word "components)" and insert -- component(s) --

Signed and Sealed this

First Day of June, 2004

JON W. DUDAS
*Acting Director of the United States Patent and Trademark Office*